United States Patent
Yan

(10) Patent No.: US 10,283,183 B2
(45) Date of Patent: May 7, 2019

(54) OPTIMAL WRITE METHOD FOR A FERROELECTRIC MEMORY

(71) Applicant: AUCMOS Technologies USA, Inc., Santa Clara, CA (US)

(72) Inventor: Tianhong Yan, Saratoga, CA (US)

(73) Assignee: AUCMOS TECHNOLOGIES USA, INC., Santa Clara, CA (US)

( * ) Notice: Subject to any disclaimer, the term of this patent is extended or adjusted under 35 U.S.C. 154(b) by 0 days.

(21) Appl. No.: 15/391,996

(22) Filed: Dec. 28, 2016

(65) Prior Publication Data

US 2018/0122453 A1    May 3, 2018

Related U.S. Application Data

(60) Provisional application No. 62/414,767, filed on Oct. 30, 2016.

(51) Int. Cl.
  *G11C 11/22*    (2006.01)

(52) U.S. Cl.
  CPC ...... *G11C 11/2275* (2013.01); *G11C 11/2273* (2013.01); *G11C 11/2277* (2013.01)

(58) Field of Classification Search
  None
  See application file for complete search history.

(56) References Cited

U.S. PATENT DOCUMENTS

| | | | | |
|---|---|---|---|---|
| 2008/0316833 | A1* | 12/2008 | Fong | G11C 11/5628 365/185.19 |
| 2011/0280059 | A1* | 11/2011 | Xiao | G11C 13/0007 365/148 |

\* cited by examiner

*Primary Examiner* — James G Norman
(74) *Attorney, Agent, or Firm* — Edward C. Kwok; VLP Law Group, LLP

(57) ABSTRACT

A method for programming a memory cell to a predetermined programmed state includesL (a) preparing the memory cell for a write operation; (b) sending a train of programming pulses, each programming pulse being a pulse having a magnitude sufficient to program the memory cell to the predetermined programmed state; (c) preparing the memory cell for a read operation; and (d) reading the programmed state of the memory cell to ascertain whether or not the predetermined programmed state is in the memory cell. In one embodiment, the method repeats steps (a)-(d), when the programmed state of the memory cell is not the predetermined programmed state. In one embodiment, the number of times steps (a)-(d) is repeated is determined based on both a probability of successfully writing the memory cell using a single write pulse and a probability of chaotic switching.

6 Claims, 2 Drawing Sheets

OPTIMAL WRITE METHOD FOR A FERROELECTRIC MEMORY

CROSS REFERENCE TO RELATED APPLICATIONS

The present application relates to and claims priority of U.S. provisional patent application ("Provisional Application"), Ser. No. 62/414,767, entitled "Optimal Write Method for a Ferroelectric Memory," filed on Oct. 28, 2016. The disclosure of the Provisional Application is hereby incorporated by reference in its entirety.

BACKGROUND OF THE INVENTION

1. Field of the Invention

The present invention relates to memory circuits. In particular, the present invention relates to efficient programming of non-volatile memory circuits, especially ferroelectric memory circuits.

2. Discussion of the Related Art

To attain the density and other performance goals, designers of advanced memory cells, including ferroelectric memory cells, have numerous technological challenges. For one, some percentage of write operations may not be successful ("non-perfect writes"). For another, during a write operation, a certain percentage of the memory cells attain a programmed state other than the intended programmed state (e.g., a cell intended to be programmed to the "0" state becomes programmed to the "1" state; this phenomenon is known as "chaotic switching").

To ensure a write operation is successfully completed, a typical write operation in many memory technologies includes a verify step after applying a write pulse—typically, a high voltage—to each memory cell to be written. FIG. 1 shows one example in the prior art, in which writing of a memory cell of an advanced memory technology, such as ferroelectric memory, is followed by a verify operation. As shown in FIG. 1, a write operation includes an initial setup step, which prepares the memory cell to be written. The write setup step may include, for example, preparing write programming voltages, address decoding, activating select transistors and word lines. This write setup step (taking place between times $t_0$ and $t_1$) spans a write-set up time indicated by $t_{WS}$ in FIG. 1. Subsequent to the write setup step, a programming voltage ("write pulse") is applied to the memory cell during the time period between times $t_1$ and $t_2$, indicated in FIG. 1 by $t_{WP}$. At time $t_2$, the memory controller sets up the memory cell for a verify operation. Setting up the memory cell for the verify operation includes, for example, preparing read voltages, pre-charging the bit lines and setting up multiplexer circuits to route the output signals of the memory cells over the bit lines to detection circuits, such as sense amplifiers. In FIG. 1, the time period (between $t_2$ and $t_3$) for setting up the verify operation is denoted $t_{RS}$. The memory cell is sensed between time $t_3$ and $t_4$, denoted in FIG. 1 by $t_{SEN}$. If the verify step indicates that the correct value is written into the memory cell, the write operation is declared successful. Otherwise, the write-verify cycle (i.e., the steps between times $t_0$ and $t_4$) is repeated one or more times, until a successful write is detected. Although each the write-verify cycles are repeated only for the memory cells that are not written successfully, for a large memory array, the number of repeated write-verify cycles can still cause a significant latency.

Error correction codes are sometimes used to relax the requirement of a 100% success rate in write operations. When data is stored using error correction codes, the memory controller can detect and correct many types of data errors. In some systems, only a predetermined number of write-verify cycles would be carried out. The required number of write-verify cycles to be carried out before cut-off is selected with the goal of ensuring a 99.7% or greater probability of a successful write operation (greater than 3 standard deviations, or ">3σ"). Integrity in such systems depends on the combination of write-verify cycles in conjunction with the use of error correction codes.

The number of write-verify cycles required to reach the goal of a 99.7% probability of a successful write depends on the probability of success of each individual write pulse. For example, with a 90% probability of success per write pulse, two retry write-verify cycles are required. With a 75% probability of success per write pulse, four retry write-verify cycles are required. With a 50% probability of success per write pulse, eight retry write-verify cycles are required. Under existing ferroelectric memory technologies, the write and read set up times (i.e., $t_{WS}$ and $t_{RS}$) are typically significantly longer than the actual write pulse (i.e., $t_{WP}$) and the sensing time (i.e., $t_{SEN}$). For example, in one technology, $t_{WS}$ and $t_{RS}$ may each be 200 ns, while $t_{WP}$ and $t_{SEN}$ are 20 ns and 50 ns, respectively. Using these times, writing with two retries requires 0.94 μs, writing with four retries requires 1.88 μs, and writing with 8 retries requires 3.76 μs.

SUMMARY

According to one embodiment of the present invention, a method for programming a memory cell to a predetermined programmed state, includes: (a) preparing the memory cell for a write operation; (b) sending a train of programming pulses, each programming pulse being a pulse having a magnitude sufficient to program the memory cell to the predetermined programmed state; (c) preparing the memory cell for a read operation; and (d) reading the programmed state of the memory cell to ascertain whether or not the predetermined programmed state is in the memory cell. In one embodiment, the method repeats steps (a)-(d), when the programmed state of the memory cell is not the predetermined programmed state. In one embodiment, the number of times steps (a)-(d) is repeated is determined based on a probability of successfully writing the memory cell using a single write pulse. Alternatively, the number of times to repeat steps (a)-(d) is determined by both a probability of successfully writing the memory cell using a single write pulse and a probability of chaotic switching per write pulse.

The present invention is better understood upon consideration of the detailed description below in conjunction with the accompanying drawings.

DETAILED DESCRIPTION OF THE PREFERRED EMBODIMENTS

The present inventors observe that the number of retry write-verify cycles that are required to reach the >3σ goal increases write latency, with the most time being taken up by the read and write setup times between the write pulses and the sensing operations. Therefore, the inventors devised an optimal write method to decrease the number of retry write-verity cycles and to decrease write latency. This method may be used with ferroelectric memory cells, such as shown in FIG. 2.

Figure 1:
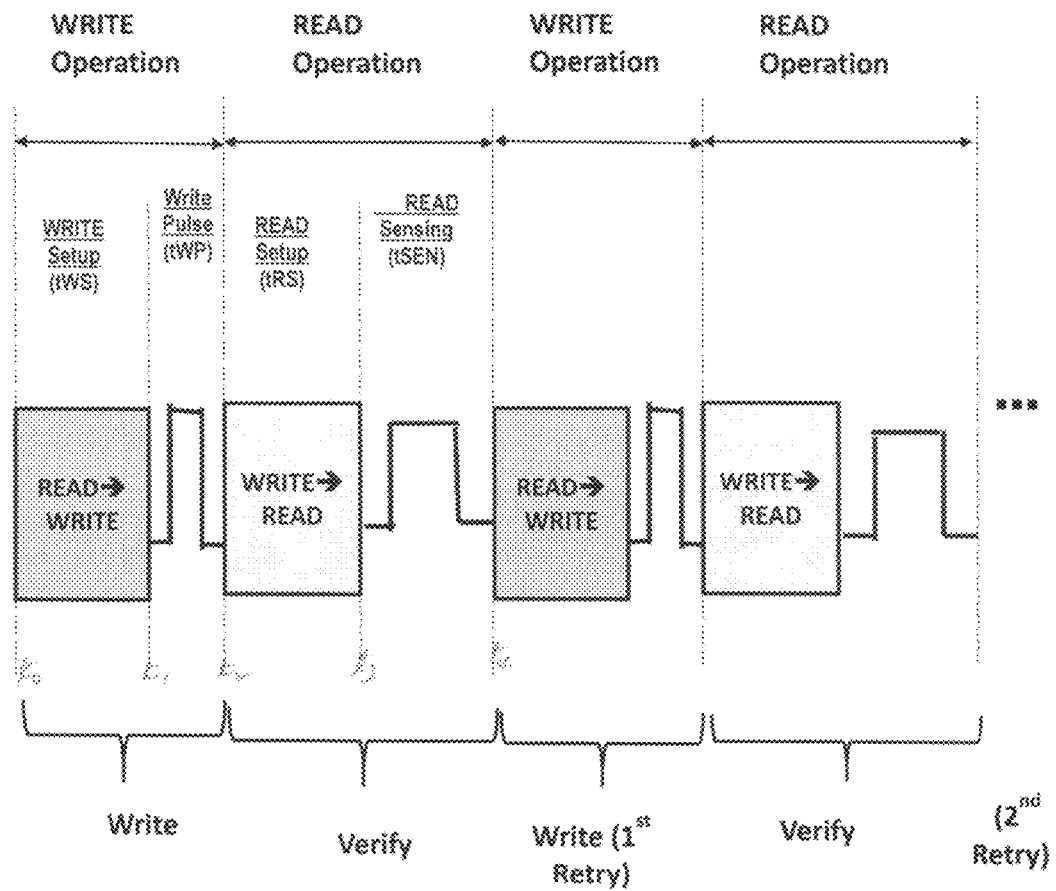
FIG. 1 shows one example in the prior art, in which a write operation in an advanced memory technology, is followed by a verify operation.
Figure 2:
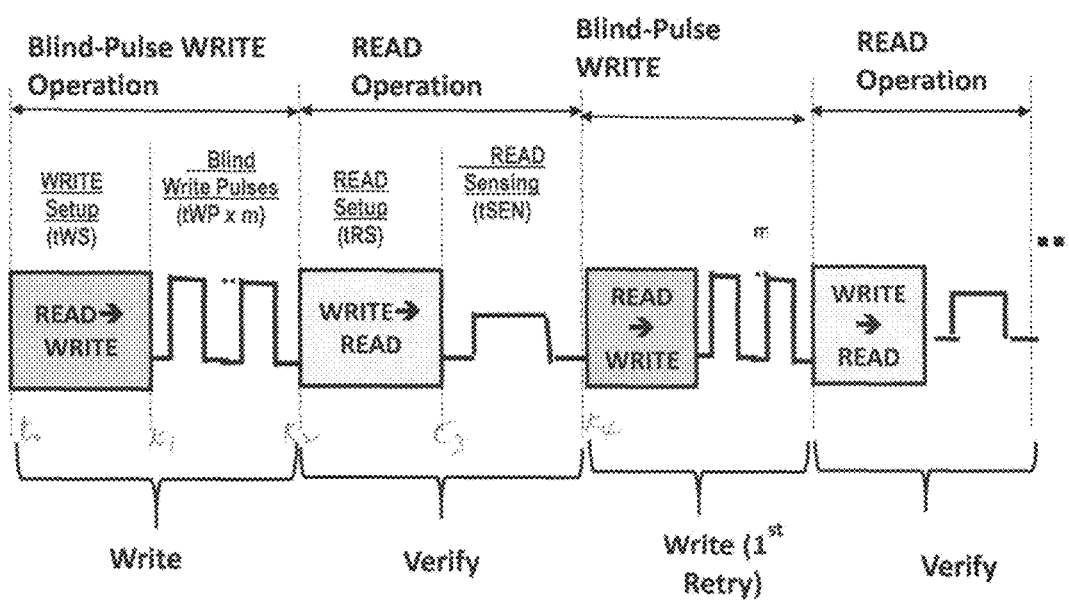
FIG. 2 shows a method for writing ferroelectric memory cells/ according to according to one embodiment of the present invention.

FIG. 2 shows a method for writing ferroelectric memory cells, according to one embodiment of the present invention. Typically, the ferroelectric memory cells are organized as a conventional memory array. As shown in FIG. 2, under this method, in each write-verify cycle, instead of sending a single write pulse to write each target memory cell after each write set-up interval, multiple write pulses are sent. These additional pulses are sent before the programmed state of each target memory cell is read back to verify a successful write operation; accordingly, the pulses are referred herein as the "blind pulses." If even after this modified write-verify operation some target memory cells in the memory array are found not to have been successfully written, the modified write-verify cycle may be repeated on these memory cells. Each write-verify cycle takes $(t_{WS}+m*t_{WP}+t_{RS}+t_{SEN})$ amount of time, where $t_{WS}$, $t_{WP}$, $t_{RS}$ and $t_{SEN}$ are the write setup time, a write-pulse duration, the read setup time, and the sensing duration, respectively, and where m is the number of blind pulses sent in each write-verify cycle.

Using this approach, the number of retry write-verify cycles that are required to meet the goal of a 99.7% or greater probability of a successful write is the smallest integer N that satisfies the inequality: $\Sigma_{i=0}^{N}(1-W)^{i}W^{m} \geq 0.997$, where m is the number of blind pulses and W is the probability of success per write pulse. Using a 50% probability of success per write pulse, the method using two blind pulses reduces the required number of retries from 8 to 4 write-verify cycles. Using four blind pulse reduces the required number of retries to two write-verify cycles. Furthermore, at a 50% probability of success per write pulse, the write latency for writing with two blind pulses is reduced from 3.76 µs to 1.96 µs and, for writing with four blind pulses, the write latency is further reduced to 1.06 µs.

The above calculation does not take into account the effects of chaotic switching. As mentioned above, chaotic switching is the phenomenon in advanced memory cells in which a write pulse, instead of writing an intended programmed state into the memory cell, writes an unintended programmed state (i.e., write failure). Chaotic switching reduces the effective probability of success per write pulse by turning a successfully achieved programmed state to an unintended programmed state.

The number of retry write-verify cycles that are required to reach the goal of a 99.7% or greater write success can be determined using empirically obtained probabilities of success per write pulse and probabilities of chaotic switching. For example, using an a 50% probability of success per write pulse, and a 25% chaotic probability per write pulse, writing with 2 blind pulses, writing with 3 blind pulses or writing with 4 blind pulses, the method of the present invention still achieves a reduction of required retries from 8 write-verify cycles to 5 write-verify cycles. At the same time, the write latencies for writing with 2 blind pulses, 3 blind pulses and 4 blind pulses are 2.45 µs, 2.55 µs and 2.65 µs, respectively. (By comparison, the single write pulse prior art method results in a 3.76 µs write latency at a 50% probability of success per write pulse).

The above detailed description is provided to illustrate specific embodiments of the present invention and is not to be taken as limiting. Numerous variations and modifications within the scope of the present invention are possible. The present invention is set forth in the accompanying claims.

I claim:

1. A method for programming a memory cell to a predetermined programmed state, comprises:
   (a) preparing the memory cell for an initial access write operation, wherein the preparing for the initial access write operation includes a write setup step;
   (b) sending a train of contiguous programming pulses during the initial access write operation, each programming pulse having a magnitude sufficient to program the memory cell to the predetermined programmed state;
   (c) preparing the memory cell for a read operation;
   (d) reading the programmed state of the memory cell to ascertain whether or not the predetermined programmed state is in the memory cell.

2. The method of claim 1, wherein steps (e) is carried out up to a predetermined number of times.

3. The method of claim 2, further comprising determining the predetermined number of times based on a probability of successfully writing the memory cell using a single write pulse.

4. The method of claim 2, further comprising determining the predetermined number of times based on both a probability of successfully writing the memory cell using a single write pulse and a probability of chaotic switching per write pulse.

5. The method of claim 1, wherein the memory cell comprises a ferroelectric memory element.

6. The method of claim 1, wherein the number of programming pulses in the train of programming pulses is selected to achieve a target probability of successful write of the memory cell within a target write latency.

* * * * *